United States Patent
Fikstvedt (10) Patent No.: US 10,454,426 B2
(45) Date of Patent: Oct. 22, 2019

(54) METHODS AND APPARATUS PROVIDING HIGH EFFICIENCY POWER AMPLIFIERS FOR BOTH HIGH AND LOW OUTPUT POWER LEVELS

(71) Applicant: Texas Instruments Incorporated, Dallas, TX (US)

(72) Inventor: Oddgeir Fikstvedt, Oslo (NO)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/827,995

(22) Filed: Nov. 30, 2017

(65) Prior Publication Data

US 2019/0165735 A1 May 30, 2019

(51) Int. Cl.
| | | |
|---|---|---|
| H03F 1/22 | (2006.01) | |
| H03F 1/02 | (2006.01) | |
| H03F 3/195 | (2006.01) | |
| H03F 3/21 | (2006.01) | |
| H03F 3/60 | (2006.01) | |
| H03F 3/16 | (2006.01) | |

(52) U.S. Cl.
CPC ............ *H03F 1/0227* (2013.01); *H03F 3/16* (2013.01); *H03F 3/195* (2013.01); *H03F 3/211* (2013.01); *H03F 3/604* (2013.01); *H03F 2200/255* (2013.01); *H03F 2203/21178* (2013.01)

(58) Field of Classification Search
CPC .......................................................... H03F 1/22
USPC .................................................. 330/311, 51
See application file for complete search history.

(56) References Cited

U.S. PATENT DOCUMENTS

| | | | | |
|---|---|---|---|---|
| 8,022,772 | B2 * | 9/2011 | Cassia | H03F 1/223 330/311 |
| 8,305,139 | B1 * | 11/2012 | Dykstra | H03F 3/45183 327/359 |
| 9,035,697 | B2 * | 5/2015 | Youssef | H03F 3/68 330/311 |
| 9,419,565 | B2 * | 8/2016 | Nobbe | H04B 17/12 |
| 10,038,418 | B1 * | 7/2018 | Ayranci | H03G 3/3036 |

OTHER PUBLICATIONS

Chakraborty et al., "An Ultra Low Power, Reconfigurable, Multi-standard Transceiver Using Fully Digital PLL," Symposium on VLSI Circuits Digest of Technical Papers, 2013, 2 pages.
Langevelde et al., "An Ultra-Low-Power 868/915 MHz RF Transceiver for Wireless Sensor Network Applications," IEEE, Radio Frequency Integrated Circuits Symposium, 2009, 4 pages.

* cited by examiner

*Primary Examiner* — Henry Choe
(74) *Attorney, Agent, or Firm* — Ebby Abraham; Charles A. Brill; Frank D. Cimino (57) ABSTRACT

Methods and apparatus for providing high efficiency power amplifiers for both high and low output power levels are disclosed. An example apparatus includes a first amplifier to amplify a signal from a host device; and transmit the amplified signal to an antenna; a second amplifier to amplify the signal from the host device; and transmit the amplified signal to the antenna; and first, second, and third switches to: when the first and second switches are closed and the third switch is open, couple the first amplifier to the second amplifier in a parallel structure; and when the first and second switches are open and the third switch is closed, couple the first amplifier to the second amplifier in a stacked structure.

14 Claims, 8 Drawing Sheets

METHODS AND APPARATUS PROVIDING HIGH EFFICIENCY POWER AMPLIFIERS FOR BOTH HIGH AND LOW OUTPUT POWER LEVELS

FIELD OF THE DISCLOSURE

This disclosure relates generally to power amplifiers and, more particularly, to methods and apparatus providing high efficiency power amplifiers for both high and low output power levels.

BACKGROUND

Some electronic devices include one or more transceivers to communicate with other devices using radio frequency (RF) signals. Such transceivers include RF power amplifiers to convert low-power RF signals corresponding to data to a higher power signal that drives an antenna of the transceiver to transmit the data to other devices. Such RF power amplifiers may include an inverting amplifier to boost the received low-power signal into the high-power output signal. In some examples, an RF power amplifier may include two or more inverting amplifiers that are stacked in series to reduce the overall output voltage for low output power applications.

SUMMARY

Certain examples provide an apparatus to provide high efficiency for both high and low output power levels. The example apparatus includes a first amplifier to amplify a signal from a host device and transmit the amplified signal to an antenna. The example apparatus further includes a second amplifier to amplify the signal from the host device and transmit the amplified signal to the antenna. The example apparatus further includes first, second, and third switches to, when the first and second switches are closed and the third switch is open, couple the first amplifier to the second amplifier in a parallel structure, and, when the first and second switches are open and the third switch is closed, couple the first amplifier to the second amplifier in a stacked structure.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Some electronic devices include low-power transceivers to communicate with other devices by transmitting radio frequency (RF) signals. For example, a smart watch or mobile phone may include a transceiver to transmit data to other devices. Such devices may be small and/or battery-powered. Accordingly, an RF transceiver should limit current drawn to conserve power and have limited components to conserve silicon space. RF transceivers include power amplifiers, which amplify a low voltage periodic signal from the host device (e.g., a processor of a smart watch, mobile phone, etc.) to a high voltage periodic signal large enough to be wirelessly transmitted via an antenna. One of the largest and most power consuming components of a transceiver is the RF power amplifier. Accordingly, electronic device manufacturers and/or users desire efficient RF transceivers with efficient RF power amplifiers that consume less current and require less space.

RF power amplifiers used to transmit data may operate using (1) low-power radio applications and standards that require higher output power levels and/or (2) low-power radio applications and standards that require lower output power levels and save power. For example, transmitting small amounts of data over short distances may be performed using low output power levels (e.g., conserving power), while transmitting large amounts of data over far distances may be performed using high output power levels (e.g., to quickly and properly transferring the data). The output power (P) of an RF power amplifier corresponds to the voltage swing (root mean square voltage (V)) and the load impedance (R) (e.g., $P=V^2/R$). The maximum voltage swing is limited by the power supply (e.g., Vdd). To maximize the output power and efficiency for high output power operation, it is desirable to have as high voltage swing as possible. However, to transmit at lower output levels, the amplitude of the output voltage needs to be reduced, thereby resulting in lower efficiency. Accordingly, to increase the efficiency for low output power applications, stacking may be used to drive the amplifier into saturation and maximize the output amplitude which will be limited to Vdd/2 (e.g., for two stacked amplifiers), thereby increasing the efficiency. Stacking includes coupling two or more inverting amplifiers of a power amplifier in series, thereby reducing the output voltage swing. Additionally, the input and the output of such stacked inverting amplifiers may be coupled together so that a bias current can be reused, thereby lowering the voltage swing from each inverting amplifier and driving the inverting amplifiers into compression to increase efficiency. However, stacked power amplifiers correspond to less power for high output power applications. Examples disclosed herein provide a high efficiency power amplifier for both high and low output power levels.

One conventional technique for providing a highly efficient power amplifier includes a power amplifier that includes a DC-DC converter to reduce the power supply for low output power applications. However, such a conventional technique requires expensive external components and a large amount of silicon space. Another conventional technique includes increasing the impedance of the matching network (e.g., matching the impedance of the power amplifier output and the antenna's feedline) with the use of programmable passive components. However, such a conventional technique introduces extra loss in the network, which leads to poorer efficiency at high output power. Examples disclosed herein require minimal, inexpensive components to provide a highly efficient power amplifier for both high and low output levels, thereby conserving cost and silicon space.

Examples disclosed herein provide an RF power amplifier with two or more amplifying inverters that may be coupled in parallel (e.g., for high output power applications) or may be stacked (e.g., for low-power applications) through the control of a switching network (e.g., a group of switches). For example, using examples disclosed herein, the parallel structure is efficient at a high (e.g., 8 decibel-milliwatt (dBm)) output power, while the stacked structure is efficient at a low (e.g., 0 dBm) output power. Alternatively, any size amplifier can be configured as stacked and in parallel to increase efficiency of both low output power and high output power applications (e.g., depending on the control of the switching network). In this manner, examples disclosed herein are able to reduce a current needed for high output power to a lower current level for low output power applications by adjusting the structure from parallel to stacked using the switching network, thereby providing high efficiency of both high and low output powers.

Figure 1:
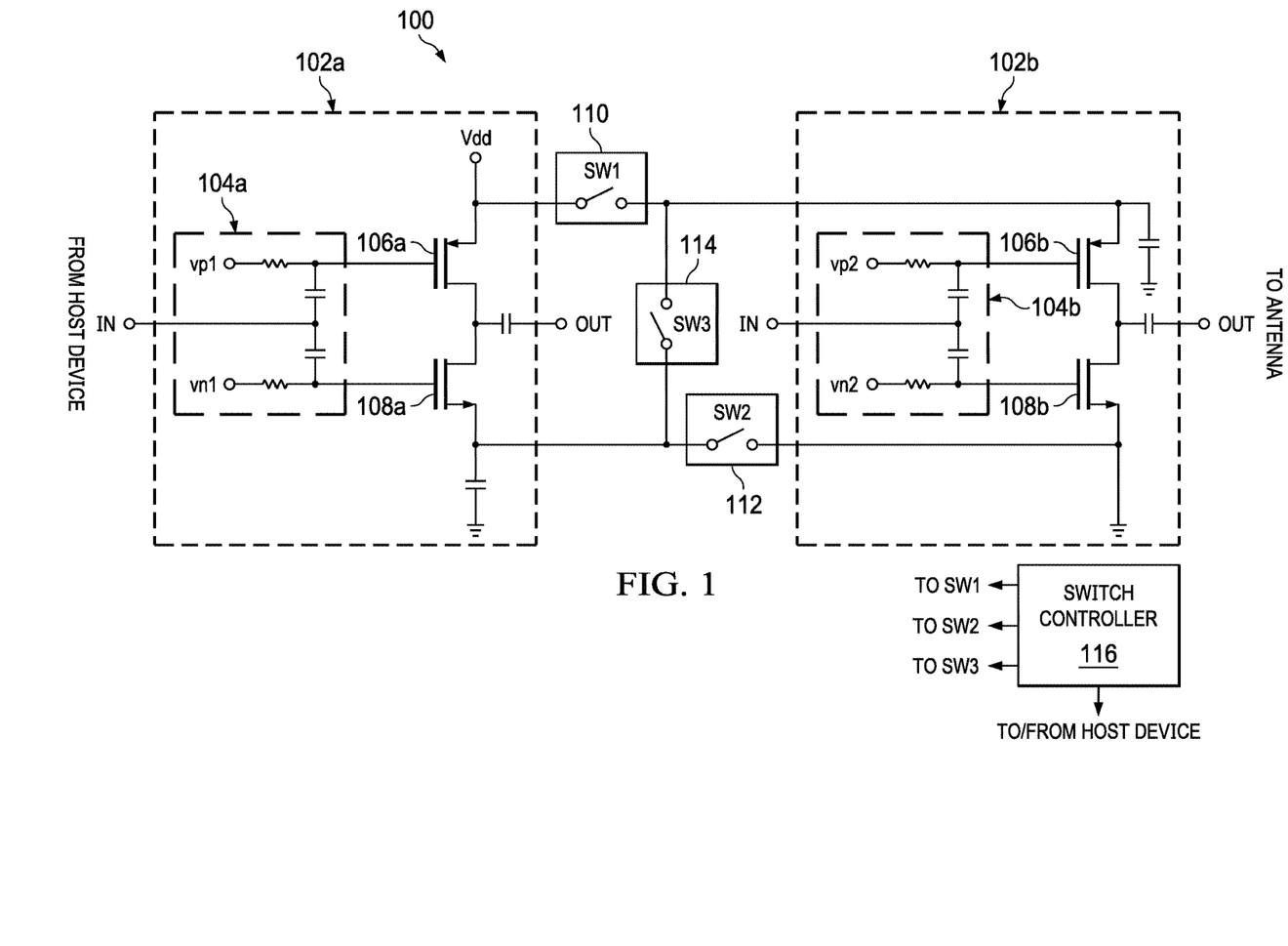
FIG. 1 is an illustration of an example RF power amplifier.

FIG. 1 illustrates an example RF power amplifier 100 capable of high efficiency for both high and low output power levels. The example RF power amplifier 100 of FIG. 1 includes example two example amplifying inverters 102a-b, example filters 104a-b, example P-channel metal oxide field effect (PMOS) transistors 106a-b, example N-channel metal oxide field effect (NMOS) transistors 108a-b, an example switching network including switches 110, 112, 114, and an example switch controller 116.

The example amplifying inverters 102a-b of FIG. 1 receive an input signal from a host device, invert and amplified the input signal, and output the inverted and amplified signal to an antenna. For example, when a host device is to transmit data via the antenna, the host device may transmit a periodic signal to the example RF power amplifier 100 to increase the power of the signal before transmitting to another device via the antenna. The example filters 104a-b receive and filter the input signal from the host device (e.g., as a high pass filter) to provide the correct DC bias to gates of the example NMOS and PMOS transistors 106a-b, 108a-b. When the host device is transmitting a periodic signal to the input, the periodic signal is used to control the example complimentary transistor (CMOS) structure corresponding to the example PMOS and NMOS transistors 106a-b, 108a-b. For example, when the input signal is a low voltage, the low voltage is applied to the gates of the PMOS and NMOS transistors 106a-b, 108a-b, thereby enabling the example PMOS transistors 106a-b and disabling the example NMOS transistors 108a-b. In this manner, the example output voltage is increased (e.g., using Vdd). When the input signal is a high voltage, the high voltage is applied to the gates of the PMOS and NMOS transistors 106a-b, 108a-b, thereby disabling the example PMOS transistors 106a-b and enabling the example NMOS transistors 108a-b. In this manner, the example output voltage is shorted to ground, thereby reducing the output voltage to 0 V. In some examples, the amplifying inverters 102a-b include coupling capacitors to filter out high-frequency noise.

As described above, placing the power amplifiers in parallel is highly efficient for high output power applications, where maximum output power is desired. However, stacking power amplifiers increases efficiency at low output power levels by limiting (e.g., reducing) the maximum output amplitude, which is limited by the stacked structure. Accordingly, the example switching network 110, 112, 114 of FIG. 1 can be utilized (e.g., enabled or disabled) to structure the two example amplifying inverters 102a-b in parallel or as a stack. For example, when the first example switch 110 and the second example switch 112 are closed and the third example switch 114 is open, the example amplifying inverters 102a-b are structured in parallel for high output power operation. When the first example switch 110 and the second example switch 112 are open and the third example switch 114 is closed, the example amplifying inverters 102a-b are stacked for low output power operation. In some examples, the example switches 110, 112, 114 can be different switch types, due to the different voltage that the switches 110, 112, 114 are exposed to. For example, the first example switch 110 may be a PMOS transistor, the second example switch 112 may be a NMOS transistor, and the third example switch 114 may correspond to a transmission gate (e.g., including both a PMOS and a NMOS transistor), each switch being large enough to keep the series resistance low. The parallel/stacked structure of the example RF power amplifier 100 is further described below in conjunction with FIGS. 2A-2B.

The example switch controller 116 of FIG. 1 controls (e.g., opens or closes) the example switches 110, 112, 114 of the switching network to convert the example RF power amplifier 100 into a high output power mode or a low output power mode. For example, if the host device is a mobile phone or wearable device (e.g., a smart watch), the host device may desire high output power mode for high output power level applications to transmit data over far distances and/or to transmit large files (e.g., for file sharing, software upgrades, etc.) over a reasonable amount of time. Additionally, the host device may desire lower output power mode for low output power level applications to conserve power while transmitting data. Accordingly, the example switch controller 116 interfaces with the host device to determine which output power mode is desired and controls the example switches 110, 112, 114 based on the desired mode. For example, the host device may control a bit of a register (e.g., a configuration register) to correspond to the output mode (e.g., '1' for high output power mode and '0' for low output power mode). In such an example, the switch controller 116 controls the switches based on the value stored in the register. The example switch controller 116 is further described below in conjunction with FIG. 5.

Figure 2A:
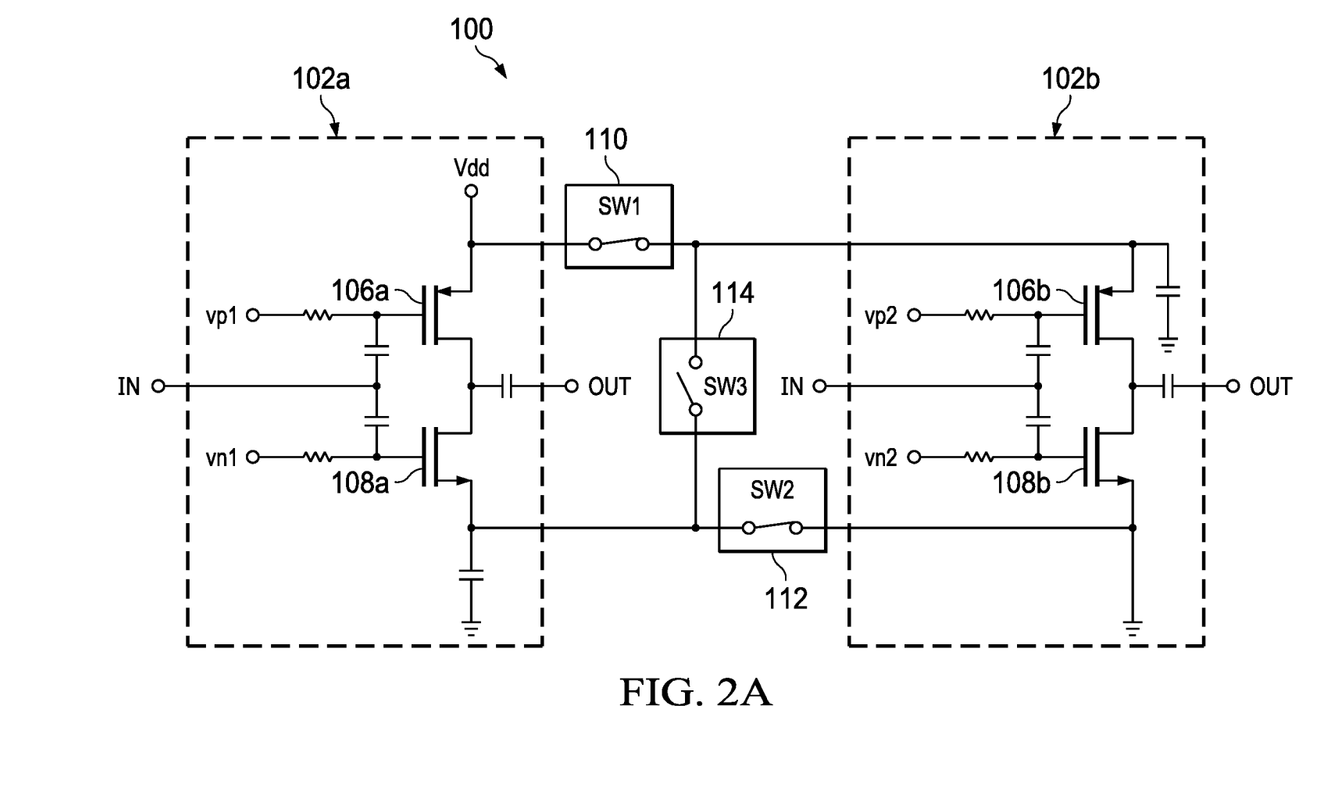
FIG. 2A is an illustration of the example RF power amplifier of FIG. 1 in a parallel structure.
Figure 2B:
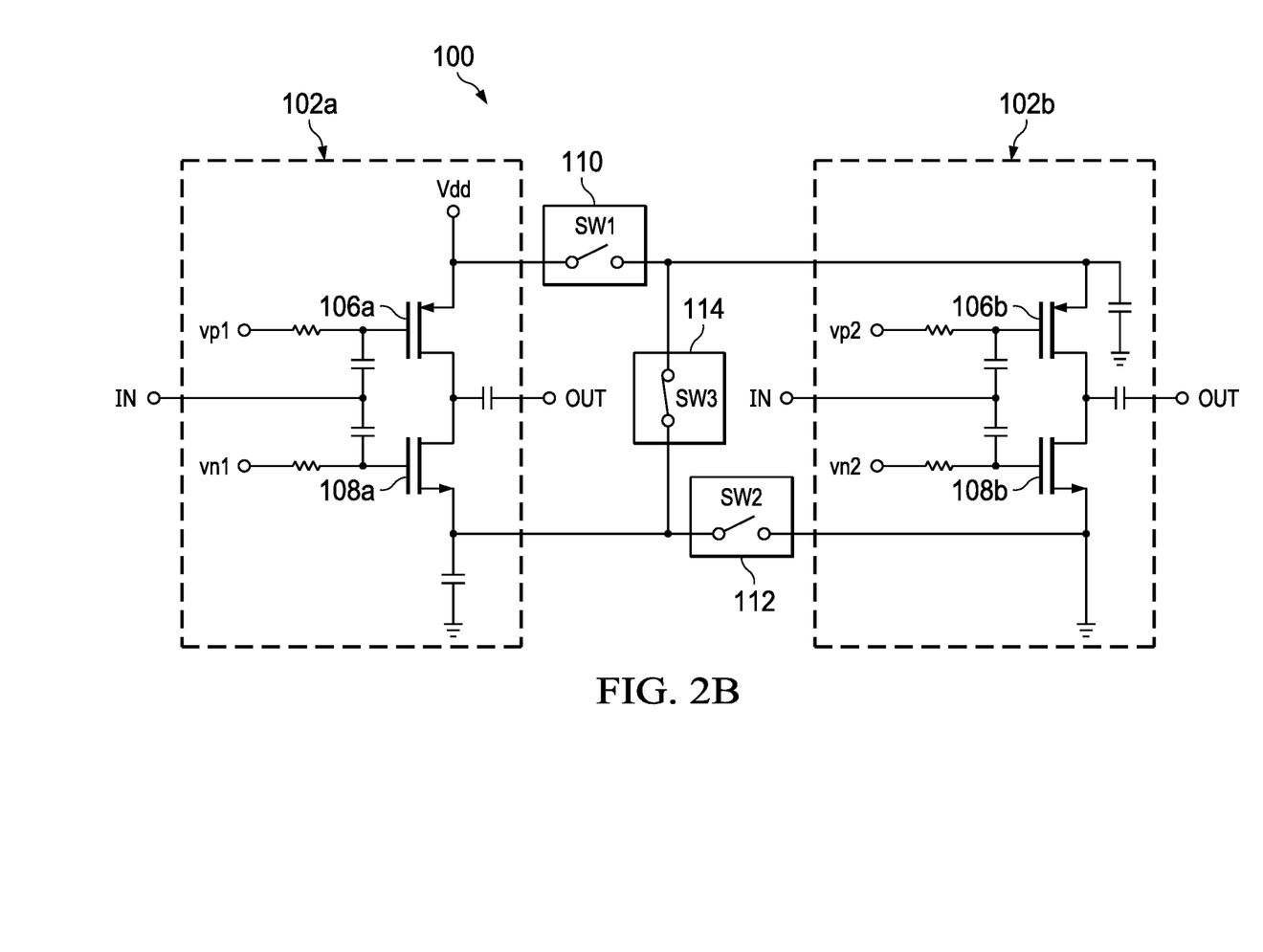
FIG. 2B is an illustration of the example RF power amplifier of FIG. 1 in a stacked structure.

FIGS. 2A and 2B illustrate the example RF power amplifier 100 of FIG. 1 in high output power mode (e.g., in parallel) and in low output power mode (e.g., stacked), respectively. The example RF power amplifier 100 of FIGS. 2A and 2B include the example amplifying inverters 102a-b, the example PMOS transistors 106a-b, the example NMOS transistors 108a-b, and the example switching network including the example switches 110, 112, 114 of FIG. 1.

The example RF power amplifier 100 of FIG. 2A is structured in a high output power/parallel mode. In such a high output power mode, the example switch controller 116 of FIG. 1 closes the first example switch 110 and the second example switch 112 and opens the third example switch 114, thereby coupling the sources of the example PMOS transistors 106a-b together to Vdd and coupling the sources of the example NMOS transistors 108a-b together to ground. Such a parallel structure of the example inverting amplifiers 102a-b provides maximum output voltage swing for a highly efficient, high output power mode.

The example RF power amplifier 100 of FIG. 2B is structured in a low output power/stacked mode. In such a low output power mode, the example switch controller 116 of FIG. 1 opens the first example switch 110 and the second example switch 112 and closes the third example switch 114, thereby coupling the source of the example NMOS transistors 108a to the source of the example PMOS transistor 106b. Such a stacked structure of the example inverting amplifiers 102a-b allows for a bias current to be reused. Reusing the bias current corresponds to lowering the voltage swing from each of the example inverting amplifiers 102a-b, thereby allowing the inverting amplifiers 102a-b to be driven into compressions to increase efficiency in a low output power mode.

Figure 3:
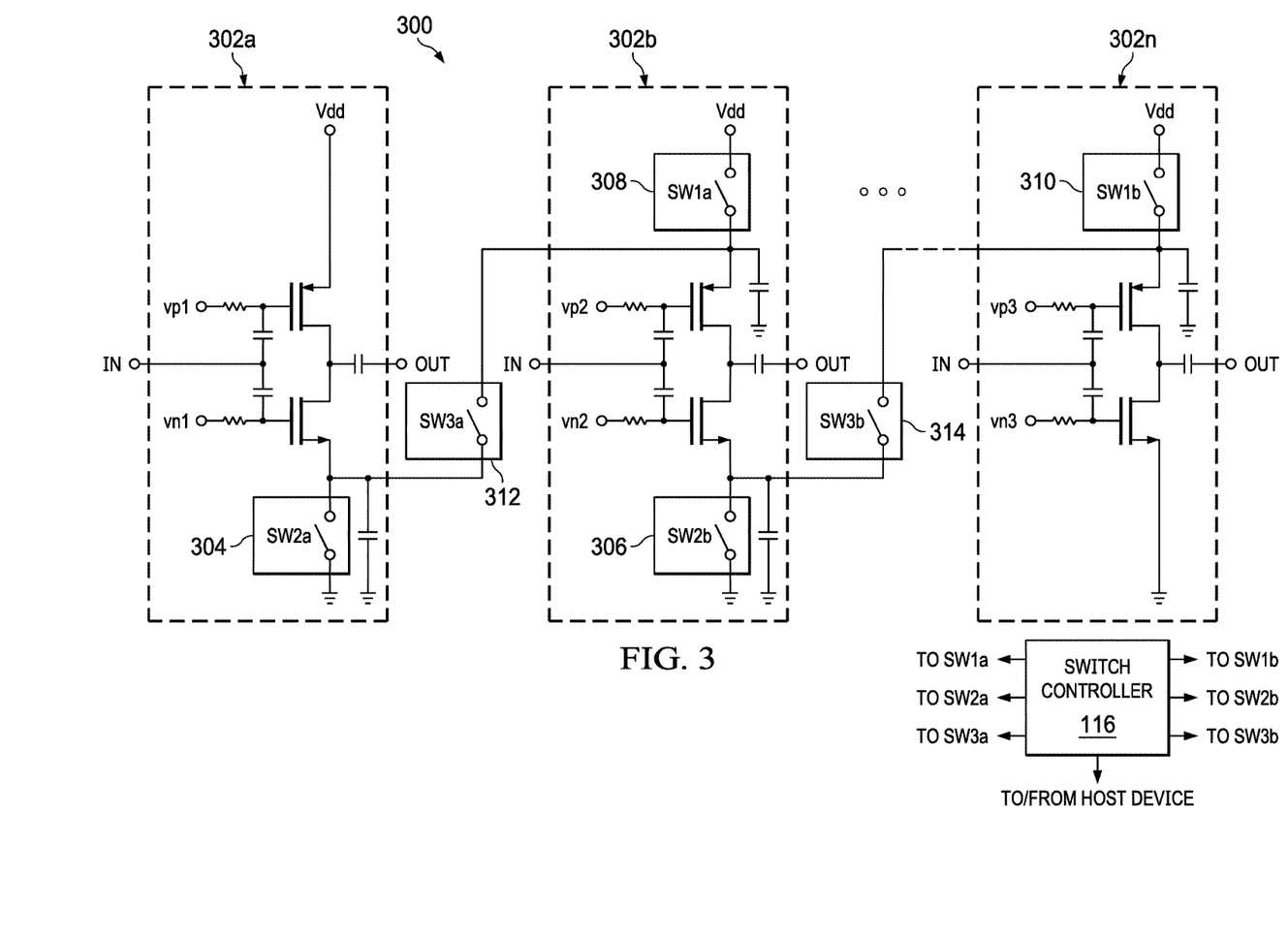
FIG. 3 is an illustration of an alternative example RF power amplifier.

FIG. 3 illustrates an alternative example RF power amplifier 300 capable of high efficiency for both high and low output power levels. The example RF power amplifier 300 of FIG. 1 includes example two example amplifying inverters 302a-n, an example switching networking including the example switches 304, 306, 308, 310, 312, 314, and the example switch controller 116 of FIG. 1.

The example RF power amplifier 300 of FIG. 3 includes multiple inverting amplifiers 302a-n to implement a multi-stacked and/or multi-parallel structured power amplifier. Although the example RF power amplifier 300 includes three inverting amplifiers 302a-n, any number of inverting amplifiers may be utilized in the example RF power amplifier 300.

The example switches 304, 306, 308, 310, 312, 314 of the switching network of FIG. 3 are controlled (e.g., opened or closed) by the example switch controller 116 to generate a parallel (e.g., for high output power mode) or a stacked (e.g., for low output power mode) structure for the example RF power amplifier 300. For example, to structure the example amplifying inverters 302a-n in parallel, the example switch controller 116 closes a first group of switches including the example switches 304, 306, 308, 310 and opens a second group of switches including the example switches 312, 314. To structure the example amplifying inverters 302a-n as a stack, the example switch controller 116 opens the first group of switches including the example switches 304, 306, 308, 310 and closes the second group of switches including the example switches 312, 314. If the example RF power amplifier 300 includes additional (e.g., more than three) inverting amplifiers, additional switches may be utilized to connect the additional inverting amplifiers to the parallel/stacked structure. In such examples, the switch controller 116 may control such additional switches. The example RF power amplifier 300 of FIG. 3 may be used to further reduce the output voltage to a lower voltage. For example, if the power supply is 1.8 Volts (Vdd) and stacking two amplifying inverters causing the output voltage to reduce to 0.9 V (e.g., Vdd/2, for two stacked amplifiers), a three amplifying inverter design may be utilized to cause the output voltage to be reduced to 0.6 V (e.g., Vdd/3, for three stacked amplifiers). The parallel/stacked structure of the example RF power amplifier 300 is further described below in conjunction with FIGS. 4A and 4B.

Figure 4A:
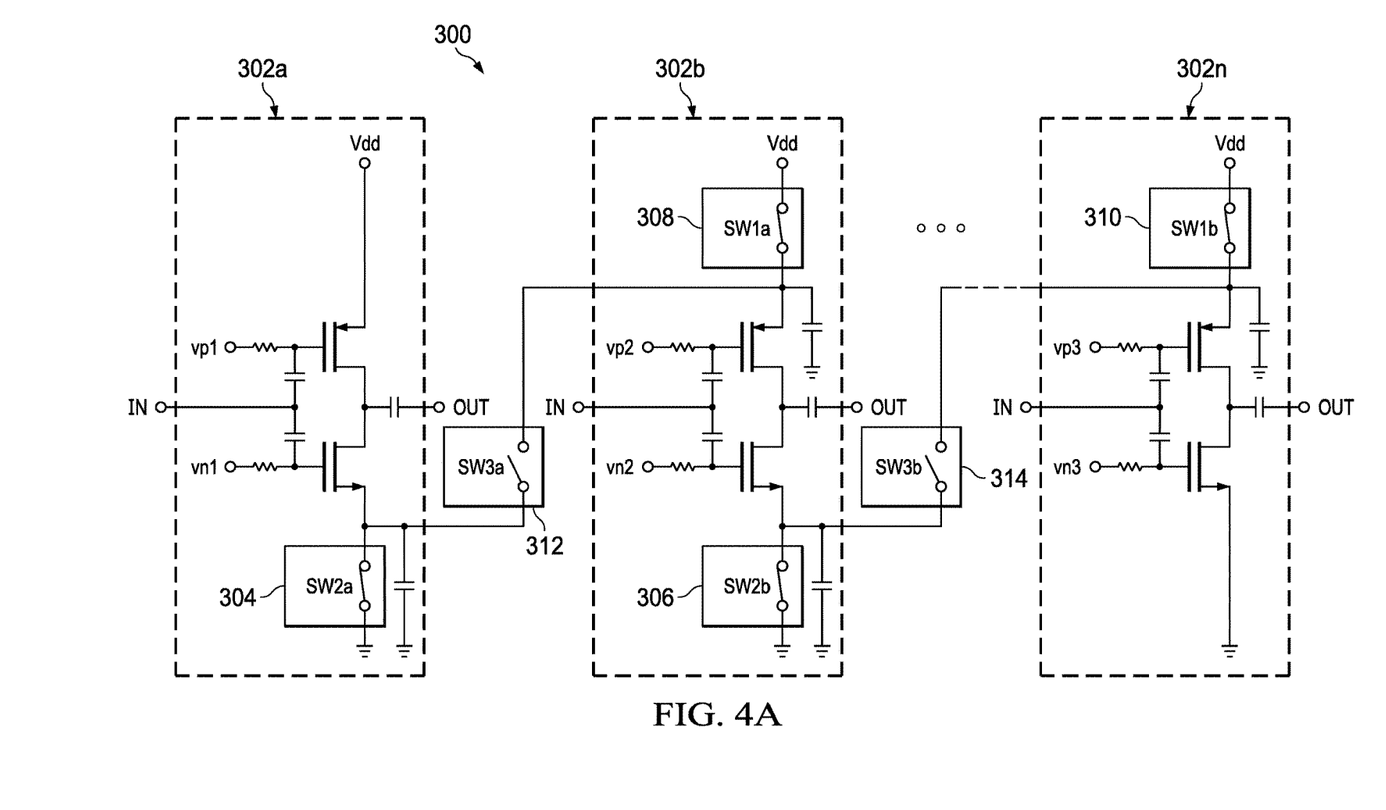
FIG. 4A is an illustration of the example RF power amplifier of FIG. 3 in a parallel structure.
Figure 4B:
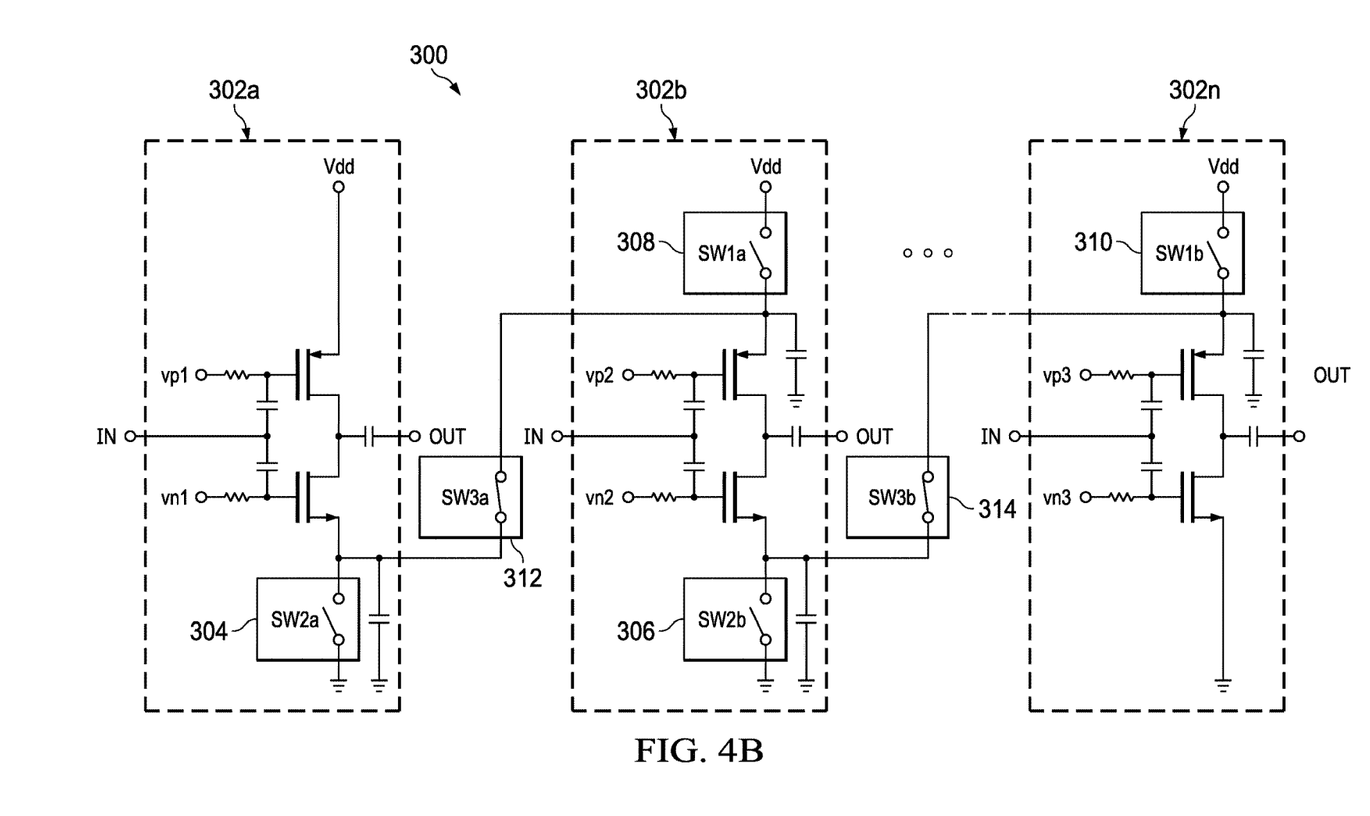
FIG. 4B is an illustration of the example RF power amplifier of FIG. 3 in a stacked structure.

FIGS. 4A and 4B illustrate the example RF power amplifier 300 of FIG. 3 in high output/power mode (e.g., in a parallel structure) and in low output power mode (e.g., in a stacked structure). The example RF power amplifier 300 of FIGS. 4A and 4B include the example amplifying inverters 302a-n and the example switches 304, 306, 308, 310, 312, 314 of FIG. 3.

The example RF power amplifier 300 of FIG. 4A is structured in a high output power/parallel mode. In such a high output power mode, the example switch controller 116 of FIG. 3 closes a first group of switches, including the example switches switch 304, 306, 308, 310 and opens a second group of switches, including the example switches 312, 314, thereby coupling the sources of the example PMOS transistors of the inverting amplifier 302a-n together to Vdd and coupling the sources of the example NMOS transistors of the inverting amplifiers 302a-n together to ground. Such a parallel structure of the example inverting amplifiers 302a-n provides maximum output power for a highly efficient, high output power mode.

The example RF power amplifier 300 of FIG. 4B is structured in a lower output power/stacked mode. In such a low output power mode, the example switch controller 116 of FIG. 3 opens the first group of switches, including the example switches switch 304, 306, 308, 310 and closes the second group of switches, including the example switches 312, 314, thereby coupling the example inverting amplifiers 202a-n in a stacked structure. Such a stacked structure of the example inverting amplifiers 302a-n allows for a bias current to be reused. Reusing the bias current corresponds to lowering the voltage swing from each of the example inverting amplifiers 302a-n, thereby allowing the inverting amplifiers 302a-n to be driven into compressions to increase efficiency in the low output power mode.

Figure 5:
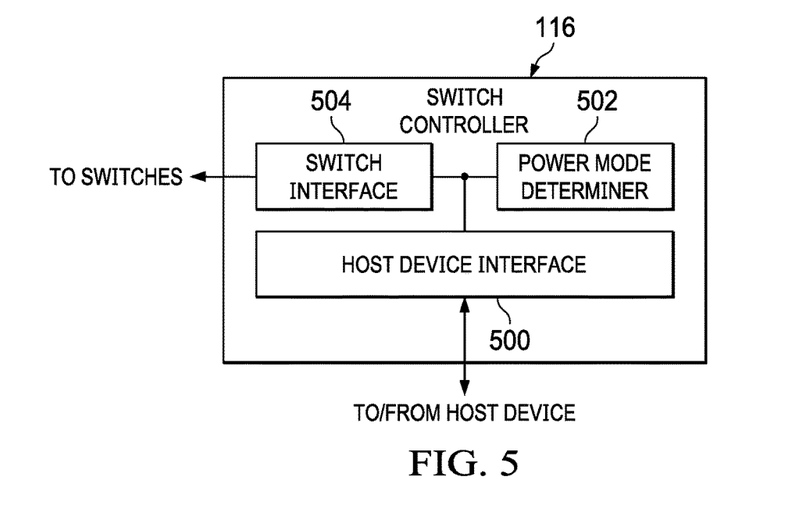
FIG. 5 is a block diagram of an example switch controller of FIGS. 1 and/or 3.

FIG. 5 is a block diagram of the example switch controller 116 of FIGS. 1 and/or 3, disclosed herein, to provide high efficiency of both high and low output power levels in the example RF power amplifiers 100, 300 of FIGS. 1 and/or 3. The example switch controller 116 includes an example host device interface 500, an example output power mode determiner 502, and an example switch interface 504. While the example switch controller 116 is described in conjunction with the example RF power amplifier 100, 300 of FIGS. 1 and/or 3, the example switch controller 116 may be utilized to control switches for any type of power amplifier.

The example host device interface 500 of FIG. 5 interfaces with the host device that is transmitting the input signal to be amplified to determine if the input signal is to be amplified using a high output power or a low output power. In some examples, the host device may transmit instructions directly to the example switch controller 116 (e.g., via the example host device interface 500). In some examples, the host device may set a bit of a register based on the desired output power level. In such examples, the host device interface 500 reads the value stored in the register so that the example output power mode determiner 502 can determine the output power level. The register may be located in the host device and/or in the example switch controller 116.

The example output power mode determiner 502 of FIG. 5 determines the output power level based on the instructions from the host device. For example, the output power mode determiner 502 determines the output power level based on the direct communication with the host device and/or the value stored in the register. In some examples, the output power mode determiner 502 may determine the output power level based on other factors. For example, if the host device is a battery-powered device, the example output power mode determiner 502 may default to the low output power mode when the charge of the battery is below a threshold amount of charge.

The example switch interface 504 of FIG. 5 transmits signals to the example switching network of FIGS. 1-4A (e.g., corresponding to the example switches 110, 112, 114, 304, 306, 308, 310, 312, 314). For example, the switch interface 504 may transmit a first voltage to one or more of the switches 110, 112, 114, 304, 306, 308, 310, 312, 314 to open the one or more switches and transmit a second voltage to one or more of the example switches 110, 112, 114, 304, 306, 308, 310, 312, 314 to close the one or more switches. In some examples, the switch interface 504 transmits a first control signal to a first group of switches and a second control signal to a second group of switches, such that the example RF power amplifier 100, 300 may be structured in parallel or structured in a stacked configuration, as described above in conjunction with FIGS. 2A-B and 4A-B.

While an example manner of implementing the example switch controller 116 of FIGS. 1 and 3 is illustrated in FIG. 5, one or more of the elements, processes and/or devices illustrated in FIG. 5 may be combined, divided, re-arranged, omitted, eliminated and/or implemented in any other way. Further, the example host device interface 500, the example output power mode determiner 502, the example switch interface 504, and/or more generally the example switch controller 116 of FIG. 5 may be implemented by hardware, software, firmware and/or any combination of hardware, software and/or firmware. Thus, for example, any of the example host device interface 500, the example output power mode determiner 502, the example switch interface 504, and/or more generally the example switch controller 116 of FIG. 5 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one the example host device interface 500, the example output power mode determiner 502, the example switch interface 504, and/or more generally the example switch controller 116 of FIG. 5 is/are hereby expressly defined to include a non-transitory computer readable storage device or storage disk such as a memory, a digital versatile disk (DVD), a compact disk (CD), a Blu-ray disk, etc. including the software and/or firmware. Further still, the example switch controller 116 of FIG. 5 may include one or more elements, processes and/or devices in addition to, or instead of, those illustrated in FIG. 5, and/or may include more than one of any or all of the illustrated elements, processes and devices.

Figure 6:
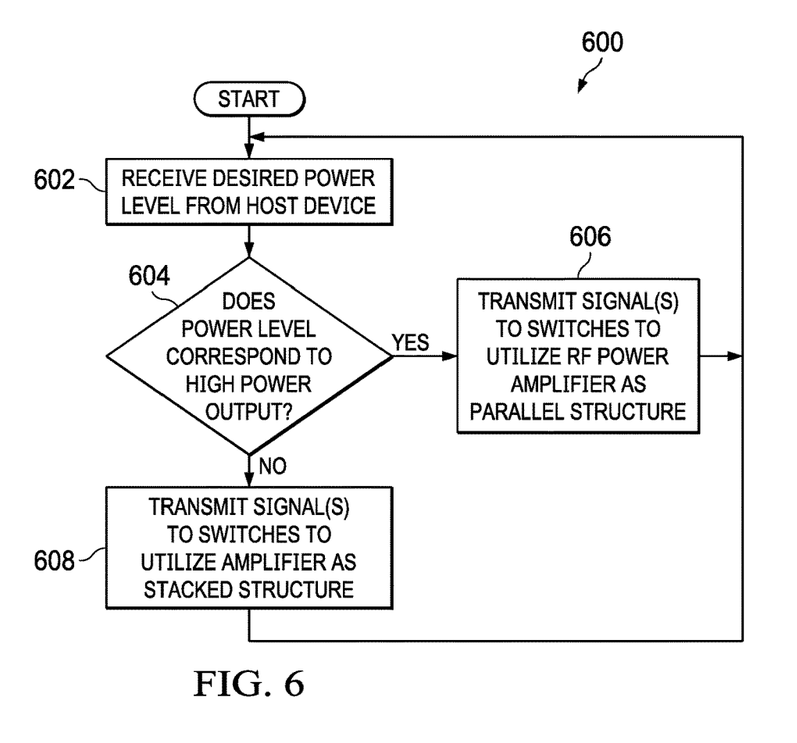
FIG. 6 is a flowchart representative of example machine readable instructions that may be executed to implement the example switch controller of FIG. 5 to structure the example RF power amplifier of FIGS. 1 and/or 3 in a parallel structure or a stacked structure.

A flowchart representative of example machine readable instructions for implementing the switch controller 116 of FIG. 5 is shown in FIG. 6. In this example, the machine readable instructions comprise a program for execution by a processor such as the processor 712 shown in the example processor platform 700 discussed below in connection with FIG. 7. The program may be embodied in software stored on a non-transitory computer readable storage medium such as a CD-ROM, a floppy disk, a hard drive, a digital versatile disk (DVD), a Blu-ray disk, or a memory associated with the processor 712, but the entire program and/or parts thereof could alternatively be executed by a device other than the processor 712 and/or embodied in firmware or dedicated hardware. Further, although the example program is described with reference to the flowchart illustrated in FIG. 6, many other methods of implementing the example switch controller 116 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, a Field Programmable Gate Array (FPGA), an Application Specific Integrated circuit (ASIC), a comparator, an operational-amplifier (op-amp), a logic circuit, etc.) structured to perform the corresponding operation without executing software or firmware.

As mentioned above, the example process of FIG. 6 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. "Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended.

FIG. 6 is an example flowchart 600 representative of example machine readable instructions that may be executed by the example switch controller 116 of FIG. 1 to structure the example RF power amplifier 100, 300 of FIGS. 1-4B as a parallel power amplifier or a stacked power amplifier. Although the instructions of FIG. 6 are described in conjunction with the example switch controller 116 FIGS. 1 and/or 5, the example instructions may be utilized by any type of switch controller to control switches in any type of RF power amplifier.

At block 602, the example host device interface 500 receives a desired output power level (e.g., high output power or low output power) from the host device. In some examples, the host device interface 500 receives the desired output power level via instructions from the host device. In some examples, the host device writes a value into a bit in a register (e.g., a configuration register of the host device and/or the switch controller 116) and the example host device interface 500 reads the value of the bit in the register.

At block 604, the example output power mode determiner 502 determines if the output power level corresponds to a high output power. The example output power mode determiner 502 may determine the output power level based on the value of the bit in the register and/or based on explicit instructions from the host device. If the example output power mode determiner 502 determines that the output power level corresponds to a high output power (block 604: YES), the example switch interface 504 transmits one or more signals to the example switches (e.g., the example switches 110, 112, 114, 304, 306, 308, 310, 312, 314) to structure the amplifiers of the example RF power amplifier 100, 300 in a parallel structure (e.g., corresponding to a highly efficient, high output power amplifier) (block 606). For example, for the example RF power amplifier 100 of FIG. 1, the example switch interface 504 closes the first example switch 110 and the second example switch 112 and opens the third example switch 114. For the RF power amplifier 300 of FIG. 3, the example switch interface 504 closes a first group of switches, including the example switches 304, 306, 308, 310 and opens a second group of switches, including the example switches 312, 314.

If the example output power mode determiner 502 determines that the output power level does not correspond to a high output power (block 604: NO), the example switch interface 504 transmits one or more signals to the example switches (e.g., the example switches 110, 112, 114, 304, 306, 308, 310, 312, 314) to structure the example RF power amplifier 100, 300 in a stacked structure (e.g., corresponding to a highly efficient a low output power amplifier) (block 608). For example, for the example RF power amplifier 100 of FIG. 1, the example switch interface 504 opens the first example switch 110 and the second example switch 112 and closes the third example switch 114. For the RF power amplifier 300 of FIG. 3, the example switch interface 504 opens the first group of switches, including the example switches switch 304, 306, 308, 310 and closes the second group of switches, including the example switches 312, 314.

Figure 7:
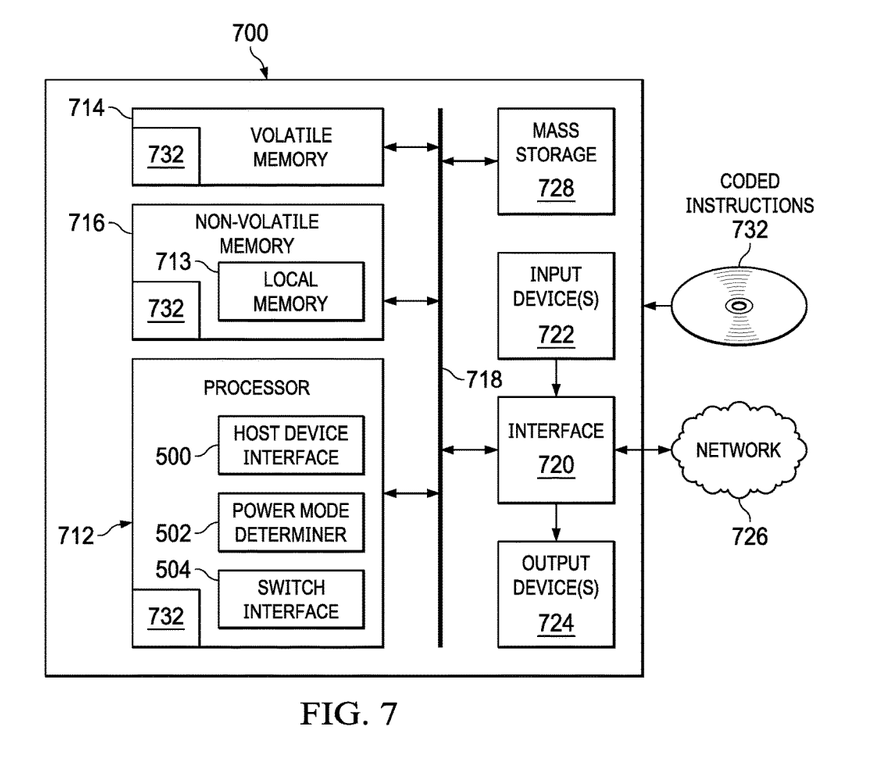
FIG. 7 is a block diagram of a processor platform structured to execute the example machine readable instructions of FIG. 6 to control the example switch controller of FIGS. 1, 3 and/or 5.

FIG. 7 is a block diagram of an example processor platform 700 capable of executing the instructions of FIG. 6 to implement the example switch controller 116 of FIG. 2. The processor platform 700 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, or any other type of computing device.

The processor platform 700 of the illustrated example includes a processor 712. The processor 712 of the illustrated example is hardware. For example, the processor 712 can be implemented by one or more integrated circuits, logic circuits, microprocessors or controllers from any desired family or manufacturer. The hardware processor may be a semiconductor based (e.g., silicon based) device. In this example, the processor implements the example host device interface 500, the example output power mode determiner 502, and/or the example switch interface 504.

The processor 712 of the illustrated example includes a local memory 713 (e.g., a cache). The processor 712 of the illustrated example is in communication with a main memory including a volatile memory 714 and a non-volatile memory 716 via a bus 718. The volatile memory 714 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 716 may be implemented by flash memory and/or any other desired type of memory device. Access to the main memory 714, 716 is controlled by a memory controller.

The processor platform 700 of the illustrated example also includes an interface circuit 720. The interface circuit 720 may be implemented by any type of interface standard, such as an Ethernet interface, a universal serial bus (USB), and/or a PCI express interface.

In the illustrated example, one or more input devices 722 are connected to the interface circuit 720. The input device(s) 722 permit(s) a user to enter data and/or commands into the processor 712. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 724 are also connected to the interface circuit 720 of the illustrated example. The output devices 724 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 720 of the illustrated example, thus, typically includes a graphics driver card, a graphics driver chip and/or a graphics driver processor.

The interface circuit 720 of the illustrated example also includes a communication device such as a transmitter, a receiver, a transceiver, a modem and/or network interface card to facilitate exchange of data with external machines (e.g., computing devices of any kind) via a network 726 (e.g., an Ethernet connection, a digital subscriber line (DSL), a telephone line, coaxial cable, a cellular telephone system, etc.).

The processor platform 700 of the illustrated example also includes one or more mass storage devices 728 for storing software and/or data. Examples of such mass storage devices 728 include floppy disk drives, hard drive disks, compact disk drives, Blu-ray disk drives, RAID systems, and digital versatile disk (DVD) drives.

The coded instructions 732 of FIG. 6 may be stored in the mass storage device 728, in the volatile memory 714, in the non-volatile memory 716, and/or on a removable tangible computer readable storage medium such as a CD or DVD.

From the foregoing, it will be appreciated that example methods, apparatus and articles of manufacture have been disclosed that provide high efficiency power amplifiers for both high and low output power levels. Examples disclosed herein provide an RF power amplifier that can be structured in parallel for high efficiency in high output power applications or can be structured as a stacked amplifier for high efficiency in low output power applications via control of a group of switches. In this manner, efficiency can be optimized for high output power and low output power with minimal additional components, thereby reducing cost and space.

Although certain example methods, apparatus and articles of manufacture have been described herein, other implementations are possible. The scope of coverage of this patent is not limited thereto. On the contrary, this patent covers all methods, apparatus and articles of manufacture fairly falling within the scope of the claims of this patent.

What is claimed is:

1. An apparatus comprising:
a first amplifier adapted to be coupled to a host device;
a second amplifier adapted to be coupled to an antenna;
a first switch having a first input and a first output, the first input coupled to the first amplifier and the first output coupled to the second amplifier;
a second switch having a second input and a second output, the second input coupled to the first amplifier and the first output coupled to the second amplifier; and
a third switch having a third input and a third output, the third input coupled to the first output of the first switch and the third output coupled to the second input of the second switch.

2. The apparatus of claim 1, further including a switch controller to control the first, second, and third switches based on instructions from the host device.

3. The apparatus of claim 1, further including a switch controller to control the first, second, and third switches based on a value stored in a register, the value corresponding to a high output power application or a low output power application.

4. The apparatus of claim 1, wherein the third switch corresponds to a transmission gate.

5. A method comprising:
receiving, at a switch controller, instructions from a host device;
in response to determining that the instructions correspond to a high output power application;
closing a first switch, wherein the first switch is coupled to the first amplifier;
closing a second switch, wherein the second switch is coupled to the second amplifier; and
opening a third switch, wherein the third switch is coupled to the first switch and the second switch;
in response to determining that the instructions correspond to a low output power application;
opening the first switch;
opening the second switch; and
closing the third switch.

6. The method of claim 5, wherein determining that the instructions correspond to a high output power application is based on a value stored by the host device in a register, the value corresponding to the high output power application.

7. A power amplifier, comprising:
a first amplifying inverter having a first node and a second node;
a second amplifying inverter having a third node and a fourth node;
a first switch coupled between the first node of the first amplifying inverter and the third node of the second amplifying inverter;
a second switch coupled between the second node of the first amplifying inverter and the fourth node of the second amplifying inverter; and
a third switch coupled between the second node of the first amplifying inverter and the third node of the second amplifying inverter.

8. The power amplifier of claim 7, wherein the first node of the first amplifying inverter is coupled to Vdd and the second node of the second amplifying inverter is coupled to ground.

9. The power amplifier of claim 7, wherein the first amplifying inverter comprises:
a first transistor coupled to the first node; and
a second transistor coupled between the first transistor and the second node, wherein the first amplifying inverter has an output node between the first transistor and the second transistor.

10. The power amplifier of claim 9, wherein the first amplifying inverter further comprises a filter coupled to a gate of the first transistor, to a gate of the second transistor, and to an input node of the first amplifying inverter.

11. The power amplifier of claim 9, wherein the first transistor is a p-channel metal oxide field effect semiconductor (PMOS) transistor and the second transistor is an n-channel metal oxide semiconductor (NMOS) transistor.

12. The power amplifier of claim 7, wherein the second amplifying inverter comprises:
a first transistor coupled to the third node; and
a second transistor coupled between the first transistor and the fourth node, wherein the second amplifying inverter has an output node between the first transistor and the second transistor.

13. The power amplifier of claim 12, wherein the second amplifying inverter further comprises a filter coupled to a gate of the first transistor, to a gate of the second transistor, and to an input node of the second amplifying inverter.

14. The power amplifier of claim 12, wherein the first transistor is a PMOS transistor and the second transistor is an NMOS transistor.

* * * * *